（12）United States Patent
Sutardja (10) Patent No.: US 12,463,604 B2
(45) Date of Patent: Nov. 4, 2025

(54) LOW NOISE AMPLIFIER INCORPORATING SUTARDJA TRANSFORMER

(71) Applicant: Sehat Sutardja, Las Vegas, NV (US)

(72) Inventor: Sehat Sutardja, Las Vegas, NV (US)

(*) Notice: Subject to any disclaimer, the term of this patent is extended or adjusted under 35 U.S.C. 154(b) by 418 days.

(21) Appl. No.: 17/711,935

(22) Filed: Apr. 1, 2022

(65) Prior Publication Data

US 2022/0321067 A1  Oct. 6, 2022

Related U.S. Application Data

(60) Provisional application No. 63/170,375, filed on Apr. 2, 2021.

(51) Int. Cl.
*H03F 3/21* (2006.01)
*H01F 27/28* (2006.01)
*H03F 1/56* (2006.01)

(52) U.S. Cl.
CPC ............... *H03F 3/21* (2013.01); *H01F 27/28* (2013.01); *H03F 1/565* (2013.01); *H03F 2200/222* (2013.01); *H03F 2200/294* (2013.01); *H03F 2200/451* (2013.01); *H03F 2200/534* (2013.01)

(58) Field of Classification Search
CPC ...... H03F 3/21; H03F 1/565; H03F 2200/222; H03F 2200/294; H03F 2200/451; H03F 2200/534; H03F 1/347; H03F 3/193; H01F 27/28; H01F 19/08
USPC ................................. 330/277, 301, 311, 250
See application file for complete search history.

(56) References Cited

U.S. PATENT DOCUMENTS

| | | | |
|---|---|---|---|
| 6,476,621 B1 | 11/2002 | Mallory | |
| 8,717,103 B2 * | 5/2014 | Leong | H03F 3/265 330/253 |
| 8,803,614 B2 * | 8/2014 | Giammello | H03F 3/45085 330/311 |
| 11,152,905 B2 * | 10/2021 | Hu | H03F 3/72 |
| 2003/0137382 A1 | 7/2003 | Mayfield et al. | |
| 2013/0337755 A1 | 12/2013 | Kim et al. | |
| 2016/0112015 A1 | 4/2016 | Chen et al. | |
| 2017/0302234 A1 | 10/2017 | Kong et al. | |
| 2020/0266775 A1 | 8/2020 | Kong et al. | |
| 2020/0336119 A1 | 10/2020 | Bagga | |
| 2021/0067117 A1 | 3/2021 | Hu et al. | |

FOREIGN PATENT DOCUMENTS

| | | |
|---|---|---|
| TW | 201406053 A1 | 8/2015 |
| TW | 201640819 A | 7/2017 |

* cited by examiner

*Primary Examiner* — Hieu P Nguyen (57) ABSTRACT

A LNA comprises an input, a transformer structure and a first transistor and a second transistor, each having gate, source, and drain terminals. The transformer structure has a first winding pair, a second winding pair and a third winding pair. Each winding of the first winding pair connects to the input node and one source terminals of the transistors. The second winding pair is proximate the first winding pair. The second winding pair connects to a ground node and the transistor source terminals. The third winding pair is proximate the first winding pair and it connects to a bias signal source and a gate terminal of the transistors. An output connects to the transistor drain terminals. The windings of the first and second winding pairs are offset and rotated 180 degrees with respect to the other winding in the pair. The third winding pair performs a Gm boost function.

19 Claims, 8 Drawing Sheets

LOW NOISE AMPLIFIER INCORPORATING SUTARDJA TRANSFORMER

1. FIELD OF INVENTION

The invention relates to low noise amplifier and in particular a low noise amplifier with a transformer structure.

2. RELATED ART

High quality Low Noise Amplifiers (LNA's) are extremely critical for radio communication devices. One of the most important characteristics of a good LNA is the ability to receive extremely faint RF signals from far distance senders (transmitters). This is because in all wireless radio communication standards, such as the ubiquitous WIFI standards, senders are required to transmit at very low power levels so that the transmissions will minimize interference with other nearby devices. However, the low transmit power constraint also drastically reduces the receive signal strength levels as RF signal strength drops exponentially with distance. Complicating matters further, radio frequency (RF) signal strength also drops when faced with obstacles such as furniture, cabinets, walls, buildings, and even dense foliage. These obstacles further attenuate RF signal levels, especially at the higher GHz RF frequencies which are used in many of today's WIFI standards.

The challenge in designing a suitable RF LNA device is well known in the industry. RF designers are aware that a suitable LNA circuit should have the properties of ultra-low noise, and high linearity in both amplitude and phase, low power consumption, high gain, high bandwidth, and high stability over a wide range of temperatures. Equally important, the LNA should be able to withstand large adjacent out of band channel interferers without losing its low-noise figure characteristics while amplifying the extremely faint far distance RF signals with minimal distortion.

Many papers and textbooks had been written over the years on how to design state of the art LNA's. LNA designs are in general categorized as current mode/common gate/common base and voltage mode/common source/common emitter topologies. The so-called current mode common base topology RF LNA was quite popular in the 1970's as bipolar transistors were just becoming more available in the market. Common base LNA topology was popular because it may meet all of the requirements of a good LNA design except for the fact that it is not low power in nature. Of course, the low power requirement was not as important in the 1970's when devices were less likely to be battery or solar powered.

Common Base LNA topology however went out of favor because integrated circuits transitioned towards the use of Metal Oxide Semiconductor (MOS) devices. Nonetheless, while MOS transistors are perfect for building digital circuits, MOS transistors are inferior when compared to their bipolar transistor counterparts when used in RF applications. MOS transistors are inherently low gain in nature, and they furthermore have much lower transconductances (Gm) when compared to that of the bipolar transistor counterparts. Unfortunately, these are precisely the transistor properties needed to build a high-performance MOS based current mode (common gate) LNA.

As a result of the limitations of MOS transistors, the voltage mode common source LNA (the equivalent of the common emitter LNA in the bipolar transistor implementation) quickly became the dominant topology for all modern wireless devices. Low cost ultra-low-noise and low power LNA devices used for WIFI and cellular applications for example, are all usually based on the common source LNA topology.

SUMMARY

To overcome the drawbacks of the prior art and provide additional benefits, disclosed is a low noise amplifier. In one embodiment, a low noise amplifier comprises an input node, configured to receive an input signal, and a first transistor and a second transistor, each having with a gate terminal, a source terminal and a drain terminal. Also part of this embodiment is a transformer structure configured with a first winding pair, a second winding pair and a third winding pair. Each winding of the first winding pair has a first end and a second end such that the first ends of the first winding pair connect to the input node and one of the second ends connects to the first transistor source terminal and the other of the second ends connects to the second transistor source terminal. The second winding pair is proximate the first winding pair. Each winding of the second winding pair has a first end and a second end. The first ends of the second winding pair connect to a ground node and one of the second ends connect to the first transistor source terminal and the other of the second ends connects to the second transistor source terminal. The third winding pair is proximate the first winding pair and each winding of the third winding pair has a first end and a second end. The first ends of the third winding pair connect to a bias signal source and one of the second ends connects the first transistor gate terminal and the other of the second ends connects to the second transistor gate terminal. An output node connects to the first transistor drain terminal and the second transistor drain terminal.

In one embodiment, the third winding pair is configured to increase the voltage across the gate terminal to the source terminal for each transistor thereby increasing the Gm of the transistors. In one configuration, the windings that form the first winding pair are rotated, with respect to each other, by 180 degrees and the windings that form the second winding pair are rotated, with respect to each other, by 180 degrees. The transformer structure may be configured in an offset overlapping configuration. It is contemplated that each winding of the first winding pair, the second winding pair, and third winding pair may be ½ turn conductor structures. The low noise amplifier may further comprise a matching network such that the matching network is located between the input node and the transformer structure. In one embodiment, the matching network comprise a low pass matching network. The low noise amplifier of claim 1 further comprising a second low noise amplifier cascaded with the low noise amplifier of claim 1. It is also contemplated that low noise amplifier may further include a common source amplifier between the input node and the transformer structure.

Also disclosed is a method for amplifying an input signal. In one embodiment, the method includes receiving an input signal such that the input signal comprising an input current, and receiving a bias signal. The bias signal and the input signal is presented to a transformer structure. The transformer structure increases the input current of the input signal to create a modified input current which is greater than the input current. The transformer structure also processes the bias signal to create a processed bias signal. This method of operation presents the modified input current to a source terminal of a transistor and presents the processed bias signal to a gate terminal of the transistor. Then, amplifying the modified input current with the transistor to create an amplified output signal.

In one embodiment, the method further comprises increasing the current of the input signal with a matching network before presenting the input signal to the transformer structure. Processing the bias signal increases a voltage differential between a gate terminal voltage and source terminal voltage, which in turn increases the Gm of the transistor. Transistor may comprise a FET. In one embodiment, the transformer structure comprises at least a first winding pair and a second winding pair located in proximity to cause coupling therebetween. Each winding of each winding pair may be rotated 180 degrees in relation to the other winding of the winding pair.

Also disclosed is a low noise amplifier embodiment comprising a non-isolated, step-up transformer structure and one or more transistors. The transformer structure is configured to receive a bias voltage and receive an input signal current. Then the transformer structure increases the input signal current to create a transformer structure output current, which is greater than the input signal current, and increases the bias voltage to create an second bias voltage. The one or more transistors are configured to receive the transformer structure output current and receive the second bias voltage, which biases the transistor. The one or more transistors process the transformer structure output current to create an amplified output signal.

In one embodiment, the transformer structure comprises offset windings which comprise wire conductors. The transformer structure comprises at least a first winding pair and a second winding pair, which are in proximity to enable coupling therebetween. For example, the first winding pair induces current flow in the second winding pair when the input signal current passes through the first winding pair, which causes the transformer structure output current to be greater than the input signal current. In addition, the transformer structure increases the bias voltage in relation to the voltage at a source terminal of the one or more transistors, which increases a Gm value for the one or more transistors. The amplifier may further comprise a matching network. The amplifier may comprise a second low noise amplifier, the second low noise amplifier comprising a second transformer structure and second set of the one or more transistors.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 1:
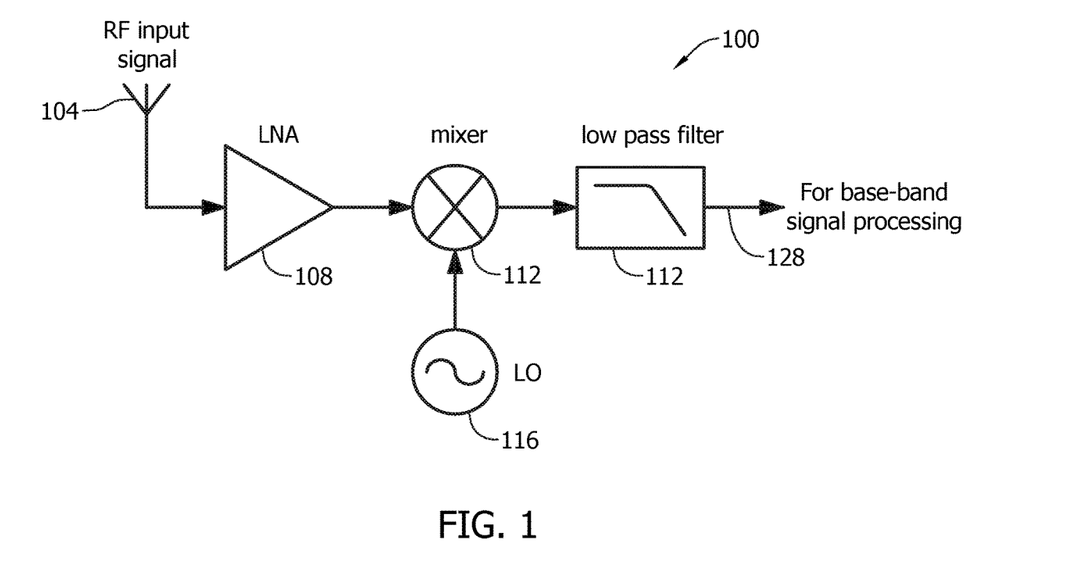
FIG. 1 illustrates a block diagram of an example environment of use.

FIG. 1 illustrates an example environment of use of the innovation disclosed herein. This is but one possible environment of use and as such other environments of use and applications are possible. The amplifier design may be used in any application where a low noise amplifier is used. This may be wireless or wireline applications, pre-drivers, or any other type of circuit or system. The system of FIG. 1 is a wireless receiver 100 that includes an antenna 104 configured to receive a wireless signal and convert the received wireless signal to an electrical signal, typically a current. The received signal is provided to a low noise amplifier 108 which increases the magnitude of the signal, such as the current magnitude of the signal. The amplifier output is provided to a mixer 112, which also receives a signal from a local oscillator 116. The mixers are widely used to shift signals from one frequency range to another to isolate a signal at a frequency of interest. The output of the mixer 112 is provided to a low pass filter to further isolate an output signal on an output terminal 128. The output signal may undergo further base-band processing as is understood in the art.

To overcome the drawbacks of the prior art, a new low noise amplifier (LNA) structure is proposed. In addition to many other benefits, this proposed solution addresses the drawbacks associated with out of band interferers and the low power level of the received signal. One problem resulting from many wireless devices (cell phones, radios, WiFi, wireless cameras, child monitors, emergency services radio) concurrently operating is that situations exist where there are many large out-of-band interferers nearby, while a receiver is trying to receive and isolate a weak signal of interest arriving from a distance location. Unfortunately, the prior art common source LNA topology is notorious for its inability to deal with large nearby interferer signals. This is because the MOS transistors, used in the common source MOS LNA, inherently have a poor noise figure and this structure needs to rely on passive voltage gain through various matching components to boost the received RF voltage signal level before applying it to the gate of the MOS transistor. Unfortunately, the same matching components used for boosting the weak in-band RF signal also indiscriminately increase the already large nearby out-of-band interferers causing the MOS transistor operating in the common source topology to saturate early. A saturated amplifier would no longer be able to properly amplify low power level RF signals.

Another challenge in the prior art with MOS implementations is that to match the low-noise performance of a common source amplifier topology, the common gate device would need to operate at roughly an order or more of magnitude higher current. However, this is unacceptable for modern portable battery-operated mobile devices due to the resulting excessive power consumption, which reduces battery life.

$G_m$ Boosted Common Gate/GB-CG (Current Mode) LNA Topology

Figure 2:
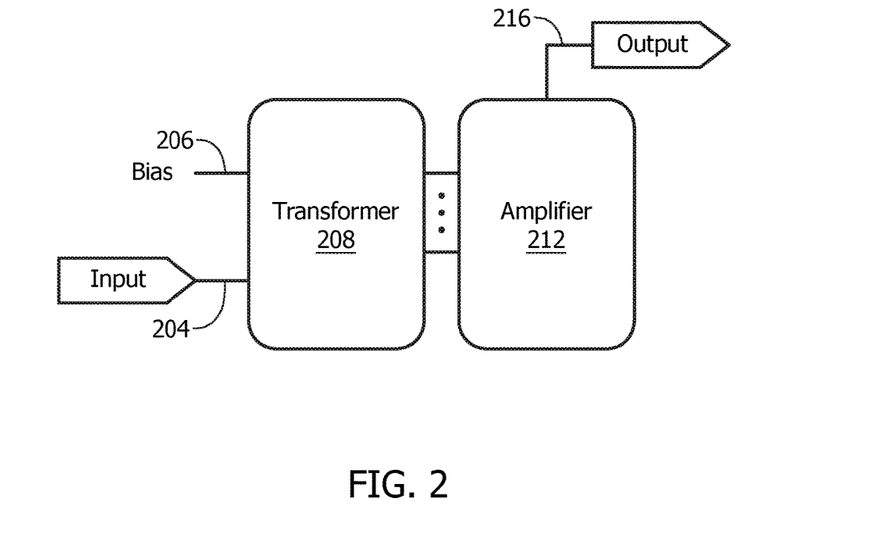
FIG. 2 illustrates Sutardja low noise amplifier having a Sutardja transformer in combination with a common gate transistor.

To overcome the drawbacks of the prior art and provide additional benefits, disclosed is a low noise amplifier which incorporates a Sutardja transformer in combination with a common gate transistor, to form a structure designated a Sutardja amplifier. As shown in FIG. 2, an input 204 is configured to receive a signal to be amplified. It is contemplated that this signal is of small magnitude, such as may be received from an antenna or other circuit element. The input signal feeds into a transformer 208 and the transformer may be one of many different configurations which function as described herein. A bias signal is also provided to the transformer 208 on a bias signal input 206. The transformer 208 has one or more outputs which connect to an amplifier device 212, such as a transistor, or any other device(s) capable of performing signal amplification (positive nor negative gain). The amplifier device 212 includes an output 216 configured to provide the amplified signal as an output signal. This is but one possible block diagram configuration and as such other configurations or arrangements are possible.

Figure 3:
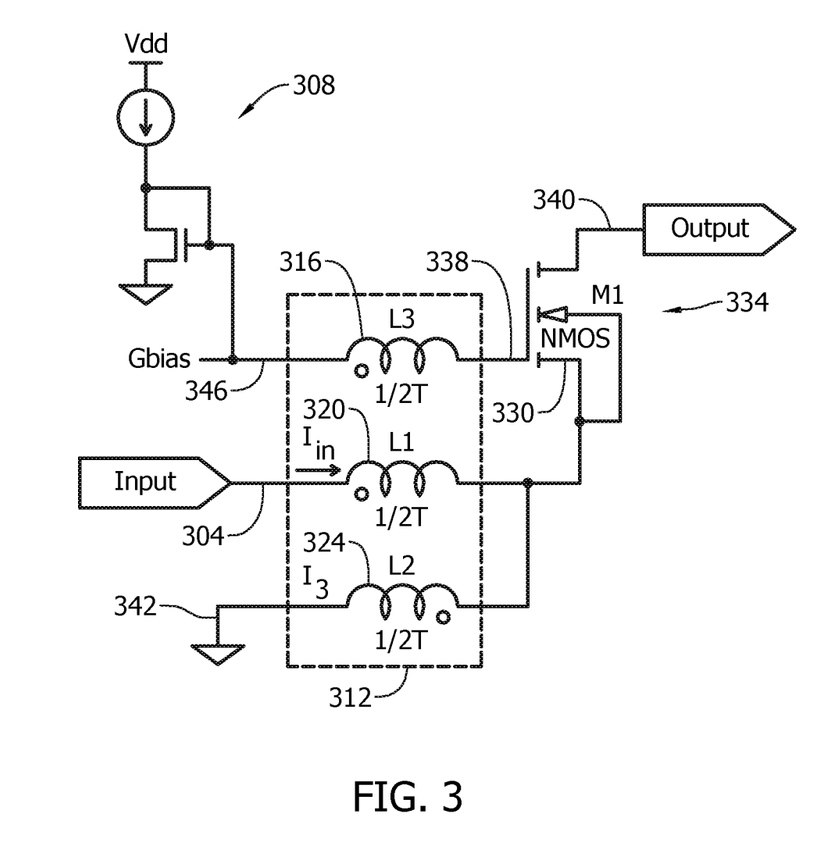
FIG. 3 illustrates an exemplary circuit layout of the Sutardja amplifier.

FIG. 3 illustrates an exemplary circuit layout of the Sutardja amplifier depicting a new class of current mode common gate LNA topology that could be readily implemented using a wide variety of modern NMOS transistors, PMOS transistors, a combination of both, or numerous other types of transistors. This design is referred to herein as a Gm boosted, common gate (GB-CG) RF amplifier topology, or a Sutardja amplifier. In this example embodiment, an input 304 is configured to receive an input signal for amplification. The input 304 connects to a Sutardja transformer 312 having one or more windings or partial winding (hereafter windings). The transfer structure 312 also receives a bias signal on a bias signal input 346 from an exemplary bias circuit 308. In other embodiments, other bias circuits may be utilized.

In this exemplary embodiment, the Sutardja transformer 312 comprises 3 windings, L1 320, L2 324, and L3 316 arranged in proximity to allow for electromagnetic coupling. Although L1 (and the other windings in the transfer 312) is shown with the same symbol as an inductor, it is a winding or conductive path that is part of the transformer. As shown, the input 304 connects to an input terminal of winding L1 320. The output terminal of winding L1 320 connects to a source terminal 330 of a FET 334. The output terminal of winding L1 320 also connects to a terminal of winding L2 324, while the opposing terminal of winding L2 connects to ground 342 as shown. The winding L3 316 connects between the bias signal input 346 and a gate terminal 338 of the FET 334. The FET 334 includes a drain terminal (output terminal) 340, which provides the amplified signal as an output signal. In this embodiment, the FET 334 is optionally body biased to reduce noise.

In operation, the bias circuit 308 generates a bias signal which biases the FET 334 via the gate terminal 338. The winding L3 316 connects to the bias circuit 308 through a bias node 346. This is but one possible bias circuit 308 and it is contemplated that other bias circuit arrangements are possible. Operation of winding L3 316 in relation to the bias signal is discussed below in greater detail.

The input signal, such as a voltage from an antenna, is converted to a current which passes directly through the winding L1 320 to the source terminal 330 without losses associated with a traditional magnetically coupled transformer that relies on magnetic coupling to convey the signal to a transistor input. As the input current passes through winding L1 320, it induces a proportional current flow in winding L2 324. Due to the different polarity, as shown by the dot notations on windings 320, 324, the current flow in the winding L2 324 also flows into the source terminal 330, thereby increasing (in this embodiment presenting two times) the input signal current $I_{in}$ to the source terminal of the FET. The ground 342 is generally the same ground as an antenna ground (not shown). This provides the benefit of establishing double (increasing) the input current to the source terminal 330 resulting a current gain of two within the passive Sutardja transformer 312. This increase in current is the result of the impedance being halved. In other embodiments, other winding ratios for the winding L2 324 and the winding L1 320 may be established to adjust the amount of current increase provided to the source terminal 330 as compared to the input current $I_{in}$. The term winding is used to define any element in which coupling may occur. The windings may comprise traditional windings, wires placed in proximity to other wires, which also establish coupling, or any other physical structure which establishes coupling between conductors.

Coupling also occurs between winding L1 320 and L3 316 (and based on the polarity of these windings) which results in an increase in the voltage presented to the gate terminal 338 as compared to the voltage on the source 330 of the FET 334. The current through winding L1 320 generates voltage on the gate terminal 338 that is opposite the voltage on the source terminal 330. This is effectively passive voltage amplification. There are very low losses due to magnetic field, Q losses, and eddy current losses in the windings, particularly in embodiments where the winding is a wire.

This increase in gate to source voltage results in a Gm boost, also referred to as a boosted Gm factor, or the gate drive factor. Gm boosted is defined as a boost or increase in the transconductance (or Gm) of the transistor. The boost in Gm results in lower noise. It is contemplated that the amount of boost (or multiplication factor) could even result in effective Gm levels exceeding that of the non-boosted Gm of bipolar transistors while consuming similar current levels of common source CMOS LNA implementations. Without the boosted Gm (the gate drive configuration) disclosed herein, common gate amplifiers of the prior art were not suitable for low noise applications. It is also contemplated that this new topology could be implemented with bipolar, JFET, PHEMPT, or any other type of transistor to obtain even higher Gm than presently possible.

As is understood, the impedance at the source 330 of the FET is Z=1/Gm. However, as a result of the gate drive configuration, impedance is defined as Z=1/(Gm*gate drive factor). The gate drive factor is defined as 1+N where N is the ratio of winding L1 to L3. In this embodiment the ratio of L1 to L3 is 1, the equation can be reduced to Z=1/(Gm*(1+1)), which reduces to Z=1/(Gm*2), which reduces the impedance looking into the source terminal 330 by a factor of two. This overcomes the usual drawbacks of MOS transistors which have poor Gm values and thus suffer from high noise. This would typically exclude MOS transistors from applications requiring low noise amplification, such as wireless environments. Without gate drive Gm boost, MOS transistors will not achieve such an ideal Gm. The impedance Z may be configured to match to the antenna impedance to reduce signal reflection.

The proposed Gm boosted common gate (GB-CG) LNA (Sutardja amplifier) topology incorporates the novel feature that instead of connecting the source of the amplifier directly to the RF source signals (typically to an antenna or an antenna filter) it instead incorporates an extremely efficient and novel RF Sutardja transformer 312.

The disclosed Sutardja transformer has several improvements over the prior art which establish beneficial characteristics. One such improvements is that due to its construction structure, it has a much higher efficiency compared to any planar RF transformers disclosed in the prior art. This improvement results in and establishes the Sutardja amplifier as an almost ideal passive RF signal current gain (as opposed to a voltage gain in the common source LNA topology). This is important as the signal that is fed to the source of the common gate amplifier is in the form of current, and in this embodiment, it is therefore possible to provide a matching impedance circuit to the extremely low source impedance of the boosted Gm of the common gate amplifier. This is discussed in more detail below in connection with FIGS. 4 and 5. Any appreciable signal losses in the Sutardja transformer 312 would be detrimental to the resulting noise figure of the overall LNA and those are avoided with the disclosed structure.

In addition, the proposed design simultaneously provides a method to drive the gate of the common gate LNA transistor to effectively boost the $G_m$ of the transistor. As a result, the gate of the FET 334 is no longer tied to a common node as is a typical configuration in a true common gate amplifier topology thus making the term common gate to be a misnomer. This term is used however, because the disclosed topology has more resemblance to the common gate LNA than to the common source LNA. In the disclosed design, the gate 338 is tied to an auxiliary gate winding (denoted as winding L3 316 in FIG. 3) of the Sutardja transformer which in turn connects to a gate bias circuit 308. This drives the gate 338 of the transistor (FET 334) in the opposite direction to the polarity of the source of the transistor (FET) with the coil 320 (or coils, or conductor) that is tightly coupled to the other windings L1 320. The input current flowing into winding L1 320 does not couple into winding L3 316 because there is a high impedance presented when looking into the gate 338 of the FET 334 so voltage coupling is occurring instead. Thus, there is voltage coupling between winding L1 320 and winding L3 316 and current coupling between winding L1 320 and winding L2 324. In this configuration, the Sutardja transformer 312 functions as both a passive current amplification and passive voltage amplification element.

While it is theoretically possible to build a transformer structure with an arbitrary turn ratio, in one embodiment, an ideal turn ratio suitable for use in a $G_m$ boosted LNA is a Sutardja transformer with a very low integer ratio value. In fact, one possible implementation for a Sutardja transformer is one with a voltage transformation ratio of 2:1 (or, due to the current application is for current transformation, this would be an equivalent of a current transformation ratio of 1:2) built using multiple parallel single turn coils as shown in FIG. 2. In one embodiment, this configuration is achieved by splitting each of the single turn coils into a pair of halves and interleaving the upper winding 320 (denoted as winding L1) and lower winding 324 (denoted as winding L2) halves of the adjacent coils. For the purpose of this discussion, the first upper winding halves may be connected between the input terminal and the transistor (FET 334) source terminal 330, while the second lower winding halves are connected between the transistor (FET) source terminal and the reference RF signal GND terminal 342.

Figure 9:
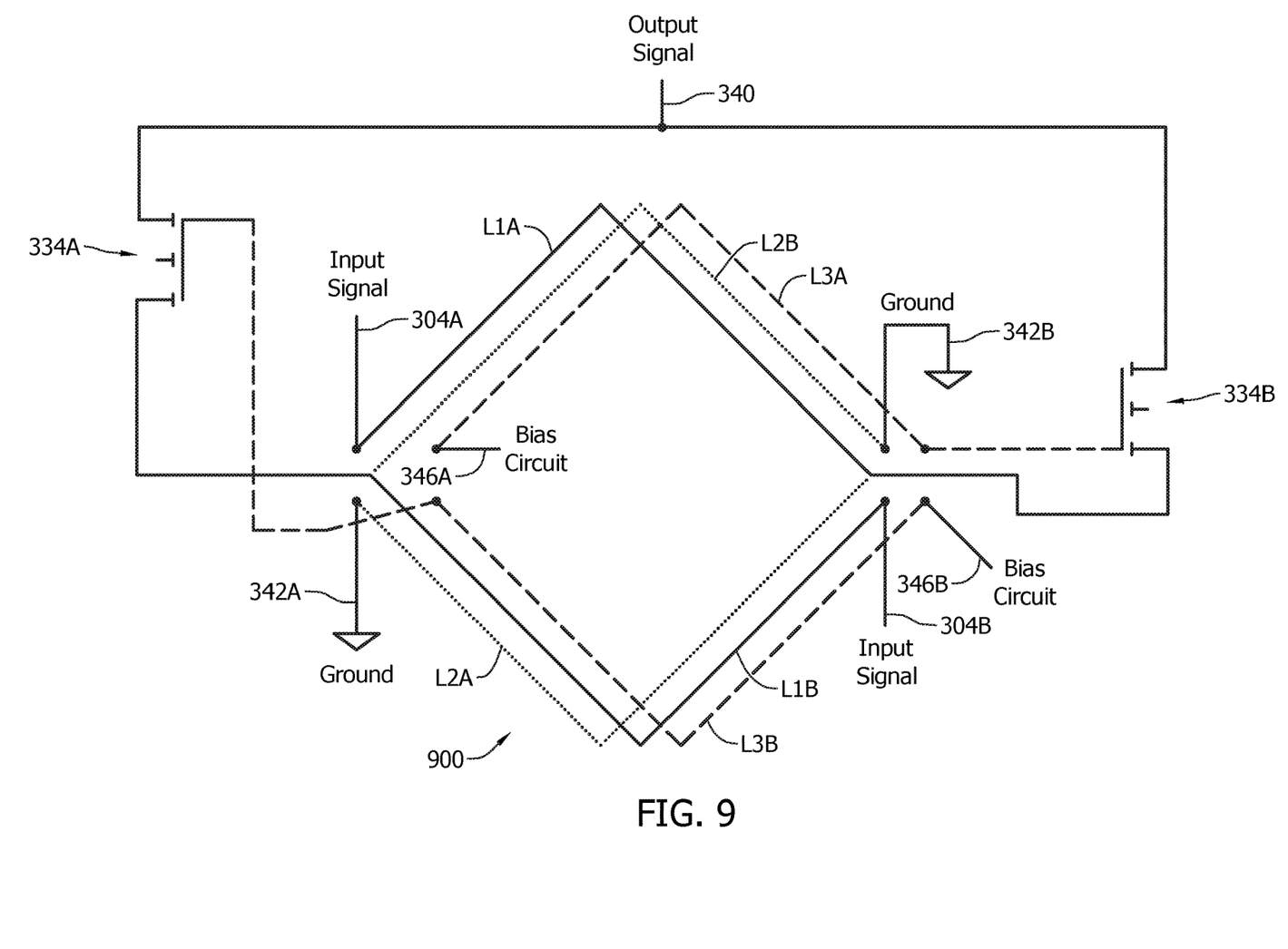
FIG. 9 illustrates an example embodiment of the Sutardja amplifier as shown in FIG. 3 configured with an offset transformer structure.

Extremely low loss is achieved by providing an almost ideal coupling between the first (upper halves) and the second (lower halves) of the coils 320, 324 to each other, whereas the coils are placed parallel and next to each other but shifted by ½ turn (meaning 180 degrees rotated and also offset from the adjacent winding) to each other as noted by the polarity dot notation. In actual implementations, the winding wires could be straight adjacent wires, or wires/conductors bent into a square, circular/oval structure, or other geometric shape to make the overall structure to look more like a normal planar transformer. FIG. 9 illustrates one example embodiment of a Sutardja transformer although numerous other structures are possible and contemplated. It should be noted that although the structure of FIG. 3 has visual similarities to an auto-transformer, its structure and operation differs as described herein.

In the case of the gate drive coil (L3 316), these wires may be connected in parallel to each other to improve the magnetic coupling between the Sutardja transformer and the gate drive coils. In addition, in one embodiment, placement of the gate drive coils (L3 316) at the outside of the Sutardja transformer maximizes the magnetic couplings between winding L1 and winding L2 sections, which ultimately maximizes the efficiency of the Sutardja transformer. Finally, while the gate drive coils may be made of ½ turn coils, it is contemplated that the design could use full turn coils, or other fractions/ratios for the gate drives to further increase the $G_m$ of the transistors to obtain an even lower noise value and/or lower power consumption.

With this structure shown in FIG. 3, the input current goes through L1 without any (or very low) loss to the source terminal, and a generally equal amount of current flows through L2 to create double the current at the source terminal as compared to the input signal current. This eliminates the efficiency loss due to current to magnetic field and the magnetic field to current transformation between winding L1 320 and winding L2 324 as is normally found in a traditional RF transformer or balun. This is another advantage over the prior art.

In one embodiment, performance improvements are realized which reduce loss when four (N=4) of the coils are implemented but more coils up to around ten would still give further improved efficiency despite the rapid increase in capacitive couplings between the many adjacent coils. This is yet another unique property of the disclosed Sutardja transformer 312 design where the increase of adjacent coupling capacitance does not degrade the performance of the RF transformer which is completely opposite to what is normally seen in a prior art RF transformers.

With, for example, 4 or 5 windings pairs interleaved, the circuit will achieve about 95% of energy transfer efficiency even before using any advanced low loss semiconductor substrate materials such as silicon on insulator (SOI) structure. This is a large improvement over traditional planar semiconductor RF transformer designs where a transformer efficiency of 75% to 80% is already considered state of the art. Furthermore, adjacent capacitive coupling capacitance is not as detrimental to the performance of the disclosed Sutardja transformer topology. For improved performance, these coils can be placed as close as possible to each other. This is precisely the opposite recommendation for a normal transformer design where the design goal is to strive for lower parasitic winding capacitive coupling capacitance. As a result, this is a further advantage over the prior art.

Finally, while it is shown that winding L1 320 and winding L2 324 are made of ½ turn coils, it is contemplated to use full 1 T coils, or any other number of turns or fractional turns may be implemented. The ½ turn coils provide better efficiency as compared to that of a structure with 1 T coils, at least for the upper GHz operating frequency. For operation in the lower GHz frequency bands, operation of the Sutardja transformer with 1 T coils for each of the windings L1 and winding L2 sections could be more efficient, at least in terms of area required for implementation.

Figure 4:
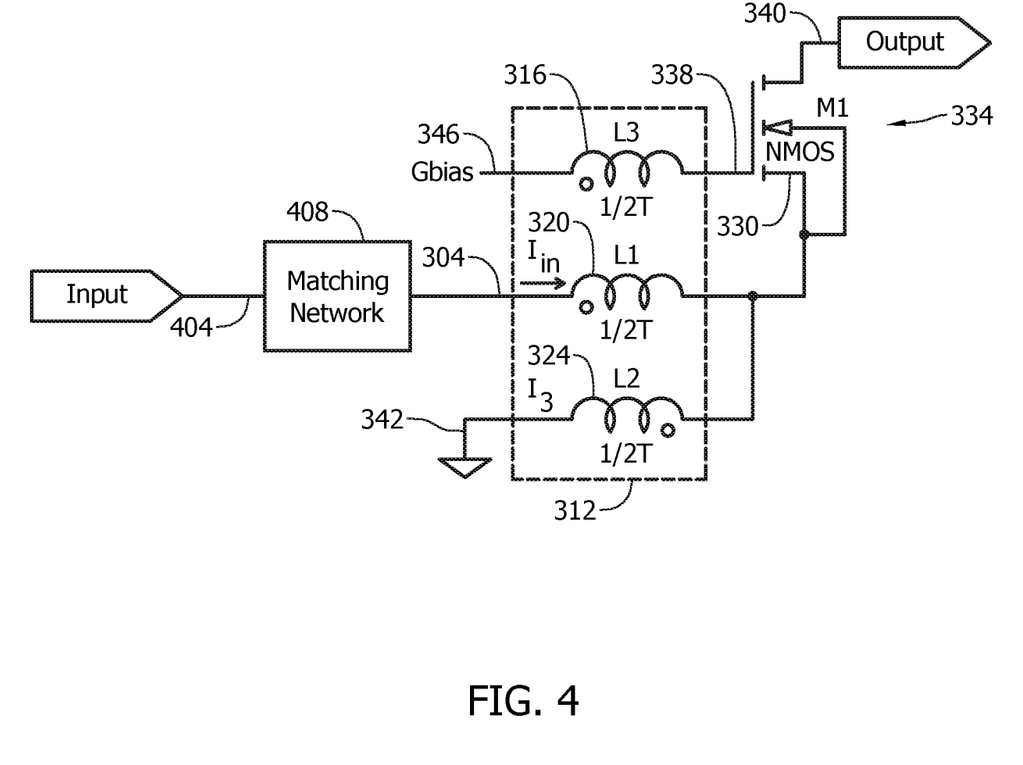
FIG. 4 illustrates an example embodiment of the circuit of FIG. 3 with one or more matching networks.

Also disclosed are additional structures and methods for further boosting the RF input current using an input matching network. FIG. 4 illustrates an example embodiment the circuit of FIG. 3 with one or more matching networks. In FIG. 4, elements which are identical to those of FIG. 3 are labeled with identical reference numbers and the discussion of those elements is not repeated. As shown, an input 404 connects to a matching network 408, which in turn may connect directly to the input 304 of the low noise amplifier. The matching network may comprise any combination of elements, such as but not limited to any combination of resistor, inductors and/or capacitors. Although shown as one matching network, it is contemplated that multiple matching networks may be provided, which is referred to herein collectively as a matching network. One of ordinary skill in the art understands that matching networks may have a number of different configurations and a different number of elements.

Figure 5:
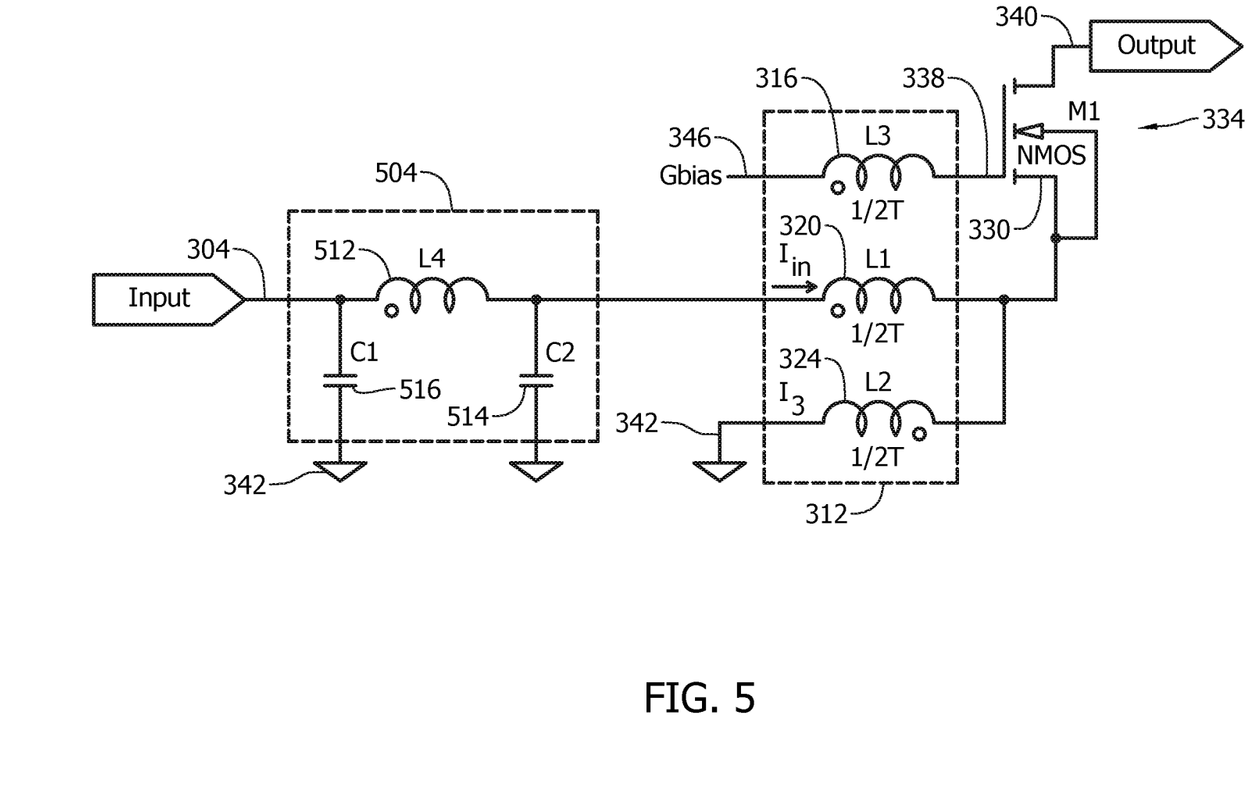
FIG. 5 illustrates an exemplary LC matching network circuit structure.

FIG. 5 illustrates an exemplary LC matching network circuit structure. Other matching network configurations are possible and contemplated, and may be made from passive elements, active elements, or a combination of both. In this example embodiment, the input 304 connects to an inductor L4 512. The opposing terminal of the inductor L4 512 connects to the input of the Sutardja transformer 312 and to an optional capacitor C2 514 that connects to ground to improve tuning. The inductor L4 is an inductor and should not be confused with the windings or conductor in the Sutardja transformer 312. The input 304 also connects to a capacitor C1 516 that has an opposing terminal connected ground 516. Adding a low pass series L-shunt C input matching network 504 in front of the 2:1 Sutardja transformer 312 further increases the overall passive current gain value by at least another factor of 2 on top of the 2 times current gain obtained from the 2:1 Sutardja transformer. Shown is a single stage low pass network but there could also be a second stage or a greater number of stages.

Each state may have a gain of 1.5 to 2.5 in typically embodiment although gain values outside this range are contemplated. The combination of the L-C matching network 312 and the Sutardja transformer 312 achieve an effective current gain that is equal to or larger than 4:1 without implementing a much more complicated 4:1 Sutardja transformer which is harder to implement. Also, because the LC matching network 504 naturally has lower losses than a transformer, the combined LC network and the Sutardja transformer 312 has the same or close to the same efficiency of a standalone Sutardja transformer as shown in FIG. 3.

Another advantage of using the LC matching network is wider band frequency response than is otherwise possible with a traditional 4:1 transformer. Moreover, the L-C matching network allows the design to achieve non-integer current gain ratio to further improve the impedance matching of the antenna port to the input port of the LNA. The non-integer current gain ratio may be achieved by adjusting the values of the inductor 512 and capacitor 516.

Multi-Stage Gm Boosted RF Amplifier Topology

Figure 6:
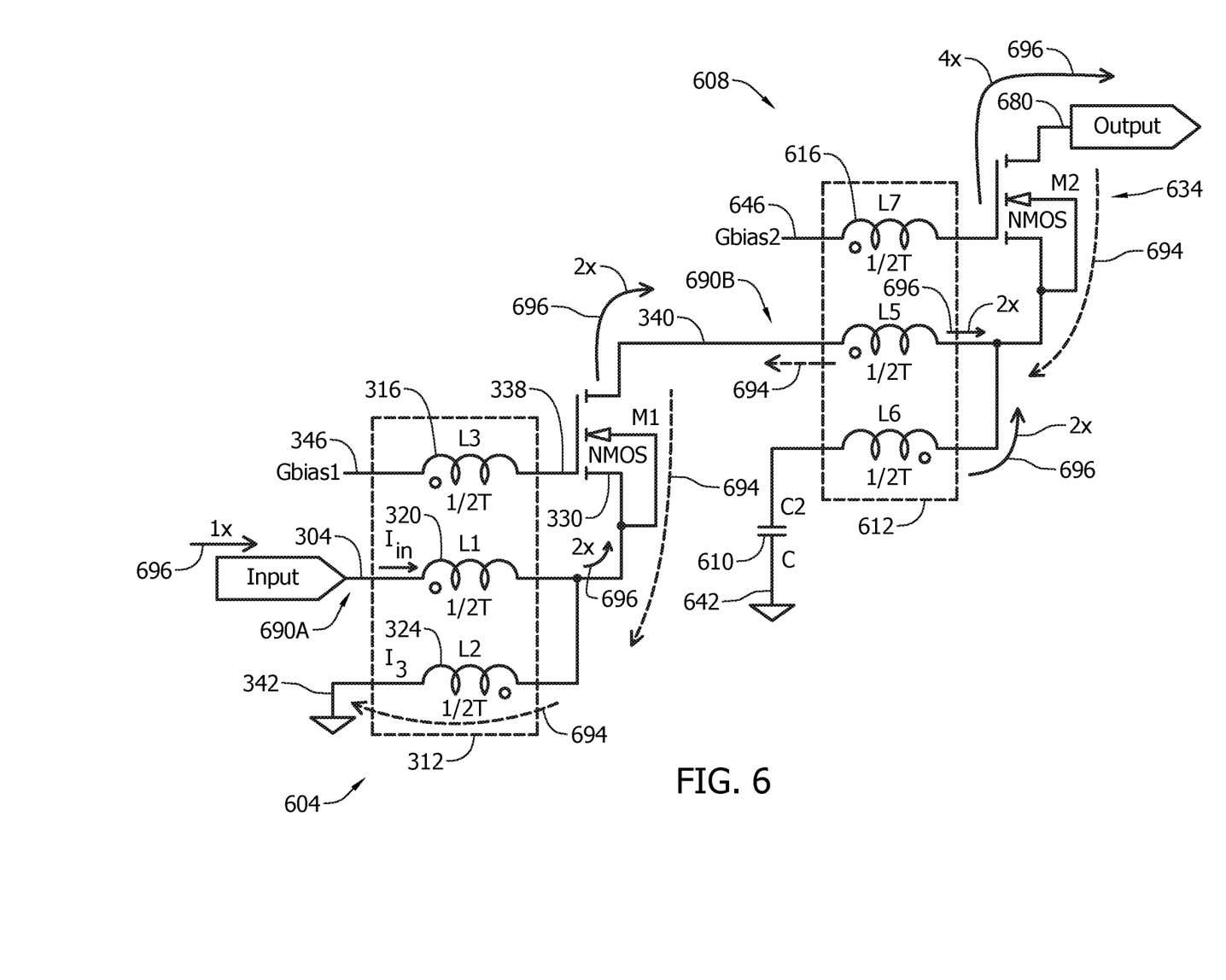
FIG. 6 depicts an example embodiment of a two stage $G_m$ boosted Sutardja amplifier topology.

FIG. 6 depicts an example embodiment of a two stage $G_m$ boosted amplifier topology, which may be used in a radio frequency environment. In this illustration, a stacked configuration duplicates a second stage current mode GB-CG low noise amplifier 608 on top of the first stage GB-CG low noise amplifier 604 to further increase its current gain while reusing the current of the first stage amplifier to save power. Alternatively, for ultra-low power supply voltage applications it is possible to replace the second stage LNA with a PMOS transistor and connect the Sutardja transformer ground terminal to Vdd.

Figure 7:
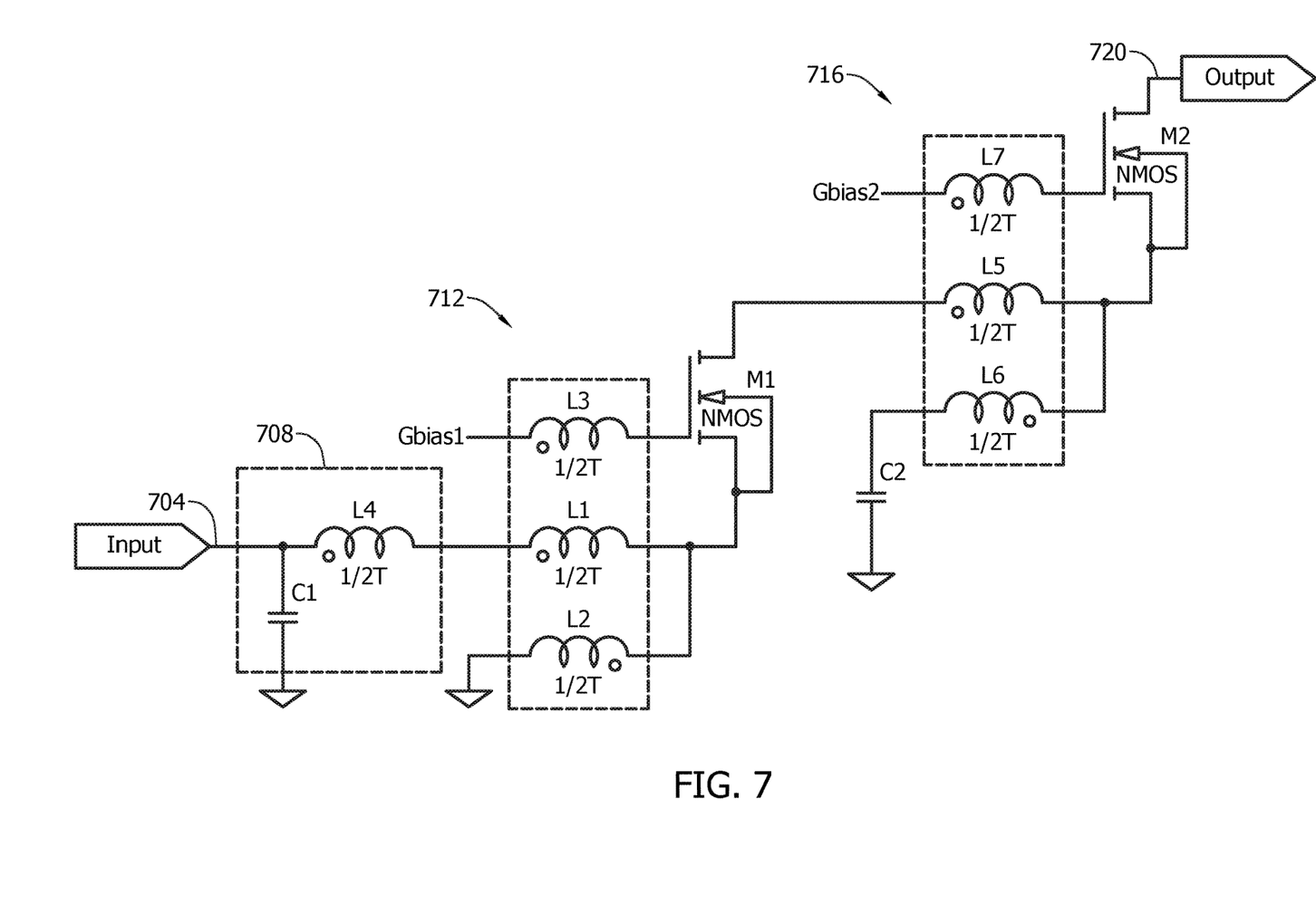
FIG. 7 illustrates an example embodiment of a two stage $G_m$ boosted Sutardja amplifier topology combined with an exemplary matching network.

As shown in FIG. 6, the output of the first stage 604 feeds into the second stage Sutardja transformer 612. A bias signal input 646 provides a bias signal to the second stage Sutardja transformer 612. The second stage Sutardja transformer 612 connects to ground 642 through a capacitor 610. The ground 642 may be the same ground 342 as found in the first stage 604. The capacitor 610 provides a DC current block and to prevent the voltage at the node between the capacitor and winding L6 from being zero. If the voltage at this node not greater zero, it would establish the output node (drain terminal) of the first stage FET at zero. The capacitor 610 allows AC signal to pass to ground while blocking DC signals. The second stage 608 also includes a second stage FET 634 which functions in a manner similar to the first stage FET 334. An output 680 from the second stage 608 connects to the drain of the FET 634. The dashed arrows 694 represent DC current flow. The solid arrows 696 represent AC signal path with the current multiplier (1×, 2×, 4×) for this embodiment. A matching network will further increase the current multiplier effect as discussed above. For example, if a matching network is included (as shown in FIG. 7), there will be a 8× current multiplier at the output 680 due to the matching network providing a 2× multiplier.

In the second stage 608, a slight modification to the connections of the Sutardja transformer 612 occurs to configure the current mode low noise amplifier stage stacking. As shown, the input of the second stage Sutardja transformer 612 connects to the drain terminal 340 of the first stage low noise amplifier while the ground 642 of the second stage Sutardja transformer 612 is connected to an AC ground through a series high frequency capacitor to the RF ground reference point.

The overall current gain of a two-stage cascaded current mode amplifier is a product of the current gain of each stage. Assuming each stage is configured with a 2:1 Sutardja transformer (providing a gain of two), the overall RF signal current gain before adding an optional L-C input matching network is therefore four times. When combined with another two times or more of current gain provided by the L-C input matching network this results in an overall current gain of eight times or higher. In the upper GHz frequency operation this is easily more than what is normally achievable in a prior art single stage, common source amplifier topology using the same low-cost CMOS processes.

This cascading structure can be expanded by adding yet another stage to create a 3-stage GB-CG LNA (not shown). Any number of stages can be configured to increase current amplification. Assuming each stage is using only a 2:1 Sutardja transformer (gain of two), a 3-stage stacked LNA circuit would give us another doubling of current gain enabling the 3-stage LNA topology to have significantly higher gain even when compared to a common source LNA built using exotic but extremely high-cost high electron mobility indium phosphide (InP) PHEMPT transistors.

Also disclosed herein is that a matching network, as discussed above, may be located between the two stages 604, 608, such as at either or both of positions 690A, 690B. This would yield another two times (or some other value based on the component values of the matching network) of gain using a stable passive circuit structure. It is also possible to utilize a variable value matching network or switched banks of inductors, capacitors to dynamically adjust the gain of the matching network. Any type structure of configuration of matching network may be used.

Stability Advantage

The disclosed design also exhibits a stability advantage over prior art designs. The current gain of GB-CG (Gm boosted, common gate) topology is determined primarily by passive gain of the Sutardja transformer and the matching network (L-C network for example, and the L-C output matching network if it exist). The overall amplifier gain would naturally be significantly less insensitive to actual transistor Gm variations (other than the fact a higher Gm is of course always better) including the normal degradation due to temperature increase, current bias variations, or even transistor process variations. This benefit exists because the current gain ratio of the Sutardja transformer is fixed by geometrical construction and it is thus, for the most part, independent of temperature variations and manufacturing process variations.

FIG. 7 illustrates an example embodiment of a two stage $G_m$ boosted RF amplifier topology combined with an exemplary matching network. As shown, the input 704 provides an input signal to a matching network 708. The output of the matching network 708 connects to the inputs of a first stage amplifier 712 configured with a Sutardja transformer. The output of the first stage amplifier 712 connects to an input of a second stage amplifier 716. The second stage amplifier 716 has an output 720 which provides an amplified signal to downstream processing elements, such as a mixer.

Each of the elements shown in FIG. 7 are discussed above in detail. Any number of matching networks, and any number of amplifier stages may be combined individually or in any configuration to create a low noise amplifier, referred to herein as a Sutardja amplifier.

Common Source and Common Gate Combination

Figure 8:
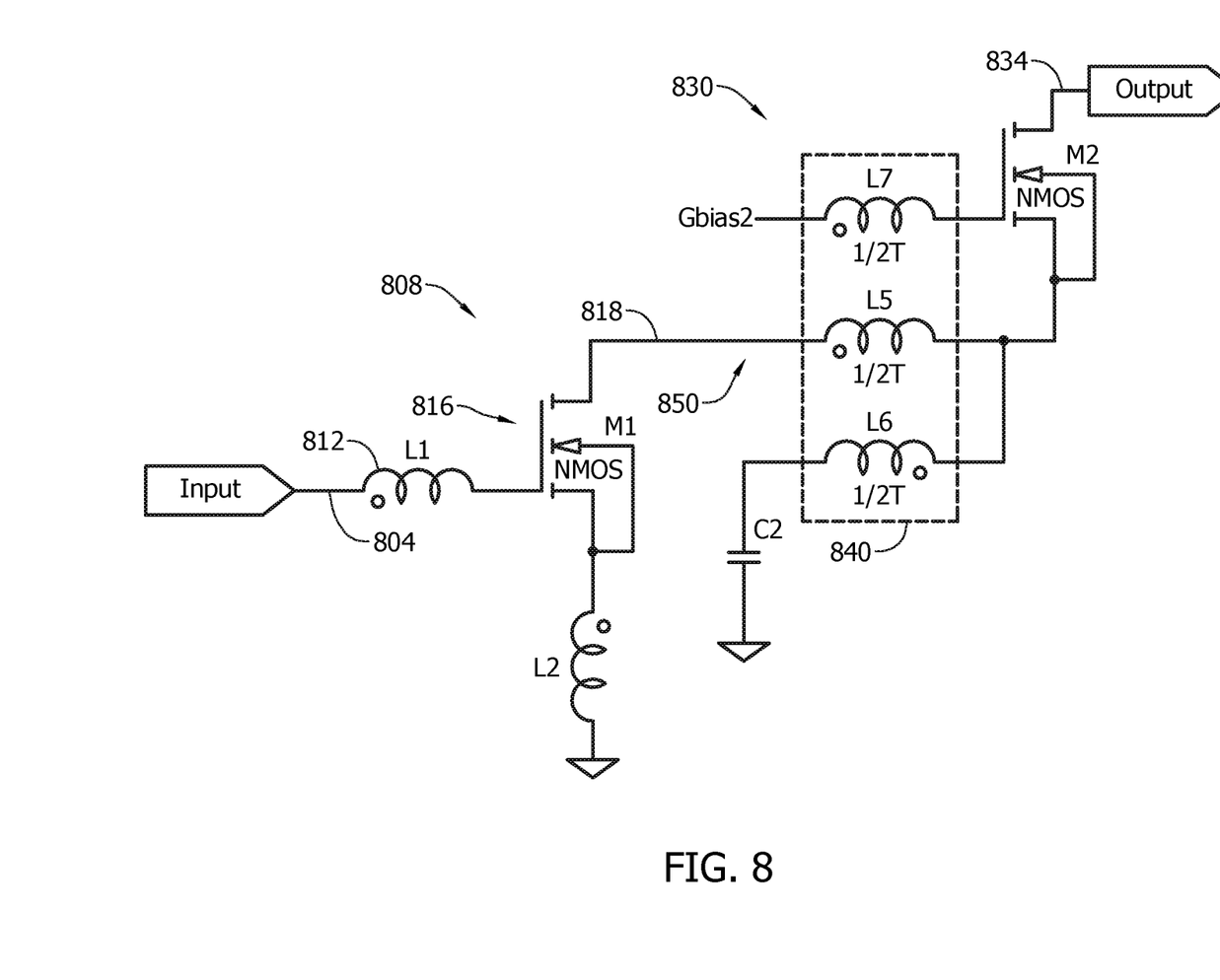
FIG. 8 depicts a combination of a traditional common source (CS) low noise amplifier stacked with a second stage $G_m$ boosted Sutardja amplifier topology.

FIG. 8 depicts a combination of a traditional common source (CS) low noise amplifier stacked with a second stage GB-CG (gate boosted, common gate) circuit. In this embodiment, an input 804 connects to a first stage common source low noise amplifier (LNA) 808. The first stage common source LNA 808 includes an inductor L1 812 and a FET 816. The inductor 812 is located in series with the input 804 and a gate of the FET 816. The output 818 of the first stage common source low noise amplifier (LNA) 808 connects to an input of the second stage GB-CG circuit 830. The second stage Gm boosted, common gate (GB-CG) circuit 830 has an output 834 which provides the amplified signal to downstream processing elements.

The benefit to this example embodiment, configured with mixed topology, is that it provides additional gain, such as an additional 6 dB of gain, in addition to the traditional common source LNA of FIG. 3 using only a single 2:1 Sutardja transformer 840, while at the same time improving the noise figure of the common source LNA due to the ultra-low impedance seen by the drain of the first stage common source LNA. The common source amplifier 808 may struggle with large interference resulting in the interference being amplified. In some application and environments (where interference is not present) that is not a concern. Note that in this example embodiment, the transistor substrate is shown connected to its own source, but this could be connected to other fixed voltage terminals or simply not connected at all when using an SOI (silicon on insulator) transistor. It is also contemplated that a matching network may be placed at location 850.

Additional Optimization

One of the unique properties of the GB-CG topology is the ultra-low impedance seen at the source of the amplifier transistor. This allows the disclosed circuit configurations to operate the radio frequency Sutardja transformer above its center resonance frequency to achieve higher current gain as operation of the circuit occurs at higher and higher operating frequency. This also allows the disclosed circuit design to inherently compensate for the natural degradation of MOS transistors when operated at higher frequency.

In addition, because the amplifier may be operated in a class AB mode, it is possible to further reduce the impedance of the transistor to further increase the transformer current gain at high power levels. Operating the transformer above its resonance frequency, together with running the transistor in a class AB mode, compensates for the large inherent MOS transistor degradation at higher power levels. This improves amplitude and phase linearity of the GB-CG amplifier when operated in class AB mode, which is extremely useful for linear power amplifier (PA) applications.

The GB-CG amplifier topology could easily be used for pre-power amplifier (PA) applications where additional gain stages may be needed in the early stages of an RF Power Amplifier (PA) signal chain. Such a pre-PA stage could alternatively be integrated into a digital SOC in CMOS technology to reduce the overall system cost.

This would allow the final external PA device, which is normally built in a much more expensive process technology such as GaAs or GaN, with fewer stages (meaning smaller die area) and therefore achieve a much higher overall gain with a lower overall power consumption and cost.

While this disclosure pertains to low-noise amplifier design, a person of ordinary skill in RF design could adapt the design techniques described in this disclosure to high power RF amplifier applications that may not necessarily need ultra-low noise performance. Also note that in this disclosure the terms low noise amplifier (LNA) and RF amplifier may be used interchangeably.

FIG. 9 illustrates an example embodiment of the circuit of FIG. 3 configured with an offset and rotated transformer structure. In this embodiment, the structure of FIG. 9 is a 2:1, non-isolated, step-up, current transformer structure, however in other embodiments other configurations are possible. To aid understanding, identical or similar elements from FIG. 3 are labeled with identical or similar reference numbers. The actual circuit is different however as is discussed below. In this embodiment, the Sutardja transformer 900 is located between two FETs 334A, 334B. This circuit is configured with two inputs 304A, 304B that connect to or are part of one example configuration of the Sutardja transformer 900. In this embodiment, the Sutardja transformer 900 has three windings L1, L2, and L3 configured as offset (side to side) and overlap. The windings L1, L2, L3 are formed from a pair of windings shown in FIG. 9 as L1A, L2B, L2A, L2B, L3A, L3B. The windings may be considered as winding pairs such that one winding of the winding pair is rotated by 180 degrees in relation to the other winding in the winding pair and shifted. It can be seen that the windings in a winding pair are rotated by 180 degrees by considering winding L1A and L1B. If L1A is rotated by 180 degrees clockwise and shifted to the side, the input 304A will be in the position of input 304B (corresponding to winding L1B). Similarly, comparing winding pair L2A, L2B, winding L2B is shifted to the right as compared to L2A, and also rotated by 180 degrees such that if winding L2A were shifted and rotated 180 degrees, ground node 342A would line up ground node 342B and the winding would also align with winding L2B.

The first winding pair is L1A and L1B. Note that winding L1A connects to the input terminal 304A and to a source terminal, while winding L1B connects to the input terminal 304B and a source terminal. Winding L2A connects to the ground node 342A and to the source terminal while winding L2B connects to the ground node 342B and the source terminal. Winding L3 can be considered as winding pair L3A and L3B, both of which connect between the bias circuit and one of the gate terminals. Each winding pair is shown with a different line type. Each winding is in proximity to another winding to facilitate coupling. Where the windings 320, 324, 316 overlap, the winding may extend upward or downward with a via to be routed on a different layer to route one winding around the other winding(s).

The winding L3A connects to the bias signal input 346A and to the gate terminal of FET 334B. The winding L3B connects to the bias signal input 346B and to the gate terminal of FET 334A. The gate bias windings are shown as single sided placement, but could be placed double sided (such as offset to the left of the existing winding structure) for symmetry. Ground nodes 342A, 342B are provided as shown connected to windings L2A and to winding L2B. The opposing side of windings L2A connects to the source terminal of FET 334B while the opposing side of windings L2B connects to the source terminal of FET 334A. Coupling occurs in the Sutardja transformer 900 as described above in connection with FIG. 3. The drain terminals of the FETS 334A, 334B connect to the output node 340 of the low noise amplifier. Operation of the circuit of FIG. 9 is generally similar to the operation of the circuit of FIG. 3. Embodiments with only a single winding exhibit poor performance because there is no conductive core and instead the core is an air core, as is typical in semiconductor implementations. A single winding would benefit from a ferrite core. Without a core structure, at least one pair is utilized.

As shown, in this embodiment, each winding is formed from one pair of ½ turn winding. In other configurations, additional pairs may be used, such as 2 pairs, 3 pairs, or any number of pairs up to N number of winding pairs (for example, L1A/L2A, L1B/L2B, L1C/L2C, L1D/L2D . . . ). Increasing the number of winding pairs increase efficiency, but as the number of pairs increase, the structure may be made larger to avoid the center space being eliminated, and this size factor will limit the number of pairs which may be added. For example, additional winding pair(s) may be placed to the left or right of the existing windings following the same offset and overlapping structure and also rotated. Further, while shown are ½ turn winding, it is contemplated that ¼ turn or other fractional winding structures may be used. Further, although shown as diamond or square shape, it is contemplated that the windings may be formed from other geometric shapes as long as the coupling between windings occur. Operation with 4 or 5 pairs has been tested as fully operational at and beyond of 6 Ghz.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A low noise amplifier comprising:
an input node configured to receive an input signal;
a first transistor and a second transistor each having a gate terminal, a source terminal and a drain terminal;
a transformer structure configured with:
a first winding pair, each winding of the first winding pair having a first end and a second end, the first ends of the first winding pair connected to the input node and one of the second ends connecting the first transistor source terminal and the other of the second ends connecting to the second transistor source terminal, wherein the windings that form the first winding pair are rotated, with respect to each other, by 180 degrees;
a second winding pair proximate the first winding pair, each winding of the second winding pair having a first end and a second end, the first ends of the second winding pair connected to a ground node and one of the second ends connecting the first transistor source terminal and the other of the second ends connecting to the second transistor source terminal, wherein the windings that form the second winding pair are rotated, with respect to each other, by 180 degrees;
a third winding pair proximate the first winding pair, each winding of the third winding pair having a first end and a second end, the first ends of the third winding pair connected to a bias signal source and one of the second ends connecting the first transistor gate terminal and the other of the second ends connecting to the second transistor gate terminal; and
an output node connected to the first transistor drain terminal and the second transistor drain terminal.

2. The low noise amplifier of claim 1 wherein the third winding pair is configured to increase the voltage across the gate terminal to the source terminal for each transistor thereby increasing the Gm of the transistors.

3. The low noise amplifier of claim 1 wherein the transformer structure is configured in an offset overlapping configuration.

4. The low noise amplifier of claim 1 wherein each winding of the first winding pair, the second winding pair, and third winding pair are ½ turn conductor structures.

5. The low noise amplifier of claim 1 further comprising a matching network, the matching network located between the input node and the transformer structure.

6. The low noise amplifier of claim 5 wherein the matching network comprise a low pass matching network.

7. The low noise amplifier of claim 1 further comprising a second low noise amplifier cascaded with the low noise amplifier of claim 1.

8. The low noise amplifier of claim 1 further comprising a common source amplifier between the input node and the transformer structure.

9. A method for amplifying an input signal comprising:
receiving an input signal, the input signal comprising an input current;
receiving a bias signal;

presenting the bias signal to a transformer structure;
presenting the input signal to the transformer structure;
increasing the input current of the input signal with the transformer structure to create a modified input current which is greater than the input current;
processing the bias signal with the transformer structure to create a processed bias signal;
presenting the modified input current to a source terminal of a transistor;
presenting the processed bias signal to a gate terminal of the transistor;
amplifying the modified input current with the transistor to create an amplified output signal; and
increasing the current of the input signal with a matching network before presenting the input signal to the transformer structure.

10. The method of claim 9 wherein processing the bias signal increases a voltage differential between a gate terminal voltage and source terminal voltage, which in turn increases the Gm of the transistor.

11. The method of claim 9 wherein the transistor comprises a FET.

12. The method of claim 9 wherein the transformer structure comprises at least a first winding pair and a second winding pair located in proximity to cause coupling therebetween.

13. The method of claim 12 wherein each winding of each winding pair is rotated 180 degrees in relation to the other winding of the winding pair.

14. A low noise amplifier comprising:
a non-isolated, step-up transformer structure, configured to:
receive a bias voltage;
receive an input signal current;
increase the input signal current to create a transformer structure output current which is greater than the input signal current, wherein the transformer structure comprises offset windings which comprise wire conductors; and
increase the bias voltage to create a second bias voltage;
one or more transistors configured to:
receive the transformer structure output current;
receive the second bias voltage, which biases the transistor;
process the transformer structure output current to create an amplified output signal.

15. The low noise amplifier of claim 14 wherein the transformer structure comprises at least a first winding pair and a second winding pair, which are in proximity to enable coupling therebetween.

16. The low noise amplifier of claim 15 wherein the first winding pair induces current flow in the second winding pair when the input signal current passes through the first winding pair, which causes the transformer structure output current to be greater than the input signal current.

17. The amplifier of claim 16 wherein the transformer structure increases the bias voltage in relation to the voltage at a source terminal of the one or more transistors, which increases a Gm value for the one or more transistors.

18. The amplifier of claim 14 further comprising a matching network.

19. The amplifier of claim 14 further comprising a second low noise amplifier, the second low noise amplifier comprising a second transformer structure and second set of the one or more transistors.

* * * * *